United States Patent
Combs et al.

(10) Patent No.: US 6,724,210 B2
(45) Date of Patent: Apr. 20, 2004

(54) METHOD AND APPARATUS FOR REDUCED PIN COUNT PACKAGE CONNECTION VERIFICATION

(75) Inventors: Michael L. Combs, Essex Junction, VT (US); Donald L. Wheater, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 119 days.

(21) Appl. No.: 09/682,345

(22) Filed: Aug. 22, 2001

(65) Prior Publication Data

US 2003/0038650 A1 Feb. 27, 2003

(51) Int. Cl.[7] ................................................ G01R 31/26
(52) U.S. Cl. ..................... 324/765; 324/158.1; 714/724
(58) Field of Search ............................... 324/73.1, 763, 324/765, 158.1; 714/43, 724, 726, 729, 731, 733–734

(56) References Cited

U.S. PATENT DOCUMENTS

| | | | |
|---|---|---|---|
| 4,565,966 A | | 1/1986 | Burr et al. |
| 5,241,264 A | * | 8/1993 | Nishiura ................... 324/158.1 |
| 5,266,901 A | | 11/1993 | Woo |
| 5,268,645 A | | 12/1993 | Prokoff et al. |
| 5,278,841 A | | 1/1994 | Myers |
| 5,502,392 A | | 3/1996 | Arjavalingam et al. |
| 5,602,989 A | * | 2/1997 | Aria ............................ 714/43 |
| 5,736,862 A | | 4/1998 | Hamblin |
| 5,923,676 A | | 7/1999 | Sunter et al. |
| 6,020,752 A | * | 2/2000 | Shimasaki ................... 324/765 |
| 6,058,496 A | | 5/2000 | Gillis et al. |
| 6,260,163 B1 | * | 7/2001 | Lacroix et al. ............. 714/726 |
| 6,397,361 B1 | * | 5/2002 | Saitoh ........................ 714/724 |

OTHER PUBLICATIONS

IBM Technical Disclosure Bulletin, vol. 37, No. 9, Sep. 1994, Interconnect Verification Method for Boards, pp. 299–302.
IBM Technical Disclosure Bulletin, vol. 8, No. 11, Apr., 1966, "Measurement of Impedances Under Dynamic Pulse Conditions", pp. 1507–1510.

* cited by examiner

Primary Examiner—Minh N. Tang
(74) Attorney, Agent, or Firm—Schmeiser, Olsen & Watts; Robert A. Walsh

(57) ABSTRACT

A method and apparatus for testing the chip-to-package connectivity of a common I/O of a semiconductor chip is disclosed which uses reduced pin count testing methods. The method includes driving a test signal transition onto a control pad of a semiconductor chip with a weak driver and comparing the transition rise time with a threshold value. For an I/O with a faulty chip-to-package connection, the rise time is much faster than for an I/O with a completed chip-to-package connection. Additional impedances may also be added to the tester fixturing to increase the sensitivity of the test equipment to the capacitance of the I/O connections.

20 Claims, 5 Drawing Sheets

*(PREVIOUSLY DISCLOSED)*

METHOD AND APPARATUS FOR REDUCED PIN COUNT PACKAGE CONNECTION VERIFICATION

BACKGROUND OF THE INVENTION

1. Technical Field

This invention relates generally to a method and apparatus for testing semiconductor chip devices and, more particularly, to a method and apparatus for verifying the connectivity of chip-to-package input/outputs (I/Os) on a high speed semiconductor chip having a common I/O, also known as bidirectional I/O (BIDI).

2. Background Art

In the testing of semiconductor chip devices, such as application specific integrated circuits (ASICs) and/or microprocessors with high speed I/Os, a variety of tests are performed to ensure proper functionality and connectivity. These tests may include, for example, time interval tests for particular semiconductor chip functions (i.e. access, setup, and hold times), and connectivity tests to determine the connectivity of a semiconductor device chip to the semiconductor device package. Conventionally, testing of a semiconductor device requires a direct connection by test equipment to each package I/O to complete all necessary tests.

With conventional semiconductor chip testing technology, time intervals are measured by a tester external to the semiconductor chip, wherein the tester provides appropriate testing signals and measures corresponding response times for a particular tested function. The particular semiconductor chip device is then characterized and classified based upon the measured response time. Testing of semiconductor chip I/Os has historically been performed with a physical tester/DUT (device under test) interface and an appropriate set of test signal patterns, waveforms, and timings created by a tester in accordance with a particular semiconductor device or chip testing procedure.

U.S. Pat. No. 6,058,496 to Gillis et al. (May 2, 2000) (hereinafter sometimes referred to as "Gillis"), the disclosure of which is hereby incorporated herein by reference, is assigned with the present invention to a common assignee. Gillis discloses a SELF TIMED AC CIO WRAP METHOD AND APPARATUS for testing a semiconductor chip. The invention of Gillis relates to a semiconductor chip with a common or bidirectional I/O pad which is electrically coupled to an off-chip driver and an off-chip receiver associated with a tester. A common I/O refers to a type of semiconductor device I/O which has both a driver and a receiver connected to the same physical pad on the device. FIG. 2 of Gillis is included as FIG. 1 herein. As shown in FIG. 1 herein, Gillis discloses and describes an invention which includes an external tester-generated launch clock 90 and a capture clock 92 which are used in AC CIO Wrap delay fault testing. The Gillis invention also includes tester drivers 102 and 104, fixturing 106 and 108, a semiconductor device pad C-4, a launch latch 112, an observation latch 114, a clock tree 100, a semiconductor chip driver 94 and a semiconductor chip receiver 96.

For the AC CIO Wrap testing method for the device shown in FIG. 1, the tester launches or triggers a "rising" or "falling" edge which propagates through the I/O to check for AC delay defects in the I/O. An "error" in the measurement is characterized by tester driver skew plus the error in the on-chip clock tree 100 fanout. The tester is not coupled to the output C-4 pad of the CIO being tested. Clock trees are shown in the FIG. to indicate that there can be a fanout of clocks and clock signals. The clocks from the clock trees may couple to multiple latches on the chip other than those shown. With LSSD (Level Sensitive Scan Delay), one clock tree feeds the L1 latches and a different clock tree feeds the L2 latches. In this way, the timing of I/Os may be tested without directly coupling a test probe to every I/O.

Conventional semiconductor device testing methods, including those disclosed in Gillis, however, do not provide a means by which a semiconductor device may be tested for package connectivity on the same testing equipment that other testing is performed. Under conventional methods, each semiconductor device must be tested for chip-to-package connectivity using separate testing equipment with test probes directly coupled to and testing each package I/O. Transfer of the semiconductor device to new testing equipment and testing each individual I/O requires additional time and cost in the testing process.

It would thus be desirable to provide a method and apparatus for verifying package connectivity for a semiconductor device which does not require transfer to additional testing equipment or connection to each individual package I/O.

DISCLOSURE OF THE INVENTION

The present invention provides a method and apparatus for measuring a rise time of a first test signal transition to determine whether a chip-to-package connection associated with an I/O of a semiconductor device is faulty. The present invention further provides a method and apparatus for measuring a rise time of a common I/O on-chip driver/on-chip receiver pair through a chip I/O without use of an external tester contact to the chip I/O pad.

In a first embodiment of the invention, a semiconductor device tester is disclosed having a driver with a weak driver impedance to drive a test signal transition to an I/O of a semiconductor device through a control pad of the semiconductor device. By driving a test signal transition with a weak driver, the response of the test signal transition is more sensitive to the capacitance associated with the semiconductor device. One or more characteristics of the response of the test signal transition are evaluated to determine whether a chip-to-package connection associated with the I/O is faulty. The impedance may also be switchably or variably coupled to the driver so that the driver may be used for other testing procedures in which a weak driver is undesirable.

To determine if a chip-to-package connection associated with a particular I/O is faulty, comparison may be made between one or more characteristics of the I/O and a connectivity threshold value. The connectivity threshold value may be determined as a predetermined ideal value, or from comparison with one or more characteristics of another I/O. In a particular embodiment, the RC constant of the transition response for a first I/O is compared to an RC constant connectivity threshold value to determine if the chip-to-package connection associated with the first I/O is faulty. If the RC constant of the transition response for the first I/O is greater than the RC constant connectivity threshold, the chip-to-package connection associated with the first I/O is identified as being faulty. The RC constant of the transition response may be determined by triggering a first latch at the start of a transition test signal, triggering a second latch when the transition test signal has risen to a predetermined threshold value, and calculating the rise time from the difference in the trigger times of the first and second latches.

In another embodiment of the invention, a fixture impedance is added to the tester device of the first embodiment between test fixturing and a semiconductor device to be tested. The fixture impedance added may improve the visibility of the effects of the weak driver impedance. In one particular embodiment, the fixture impedance is a 10 pf capacitor coupled in series with the test fixturing. The fixture impedance may also be configured as a switchable or variable impedance.

BRIEF DESCRIPTION OF THE DRAWINGS

The foregoing and other teachings and advantages of the present invention will become more apparent upon a detailed description of select modes for carrying out the invention as rendered below. In the description to follow, reference will be made to the accompanying drawings, where like reference numerals are used to identify like parts in the various views and in which.

SELECT MODES FOR CARRYING OUT THE INVENTION

Figure 1:
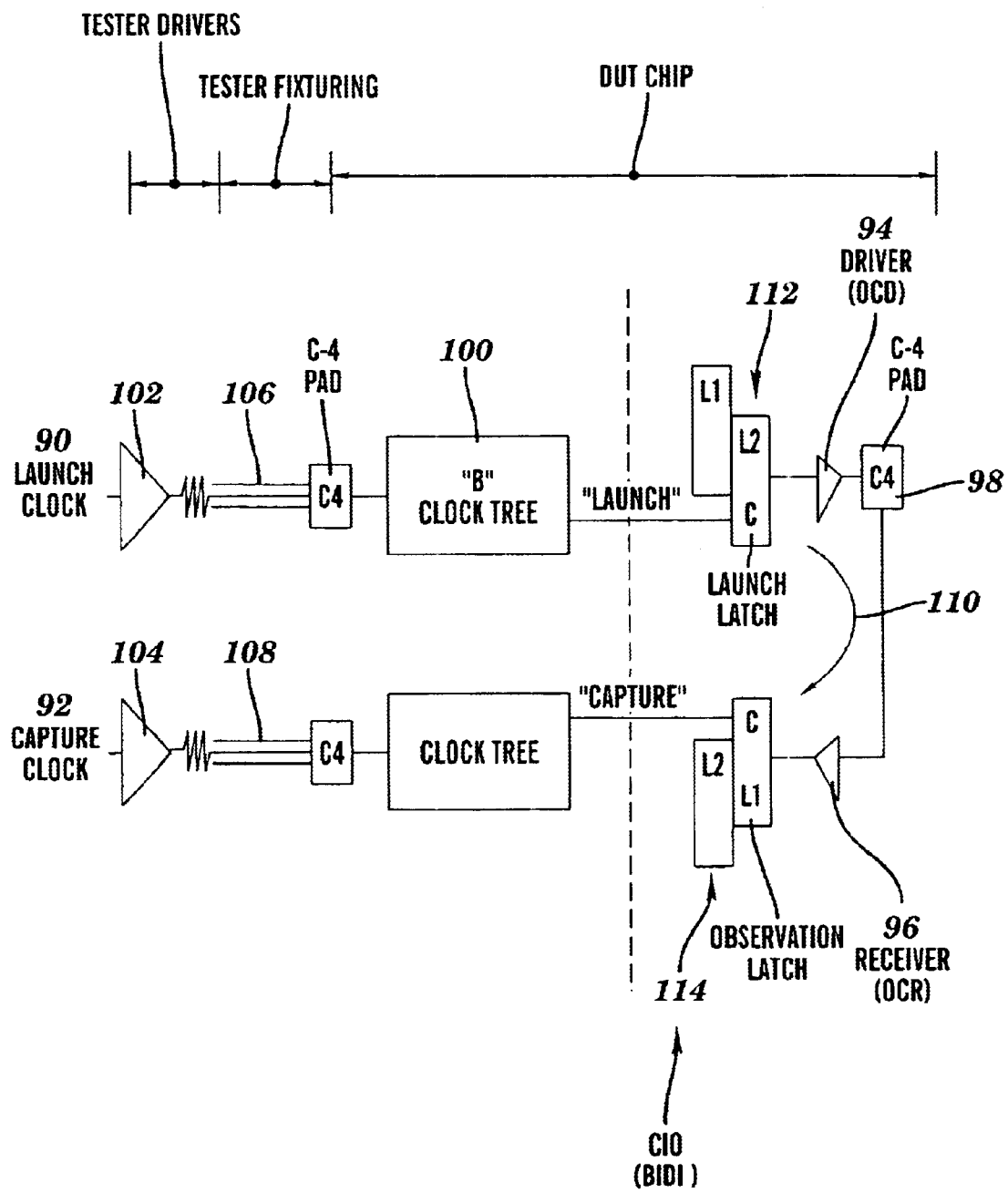
FIG. 1 illustrates a self-timed AC CIO wrap method and apparatus having a self-calibrating time base with CIO wrap measurement features for on-board setup and hold measurements which was previously disclosed in U.S. Pat. No. 6,058,496 to Gillis et al.
Figure 2:
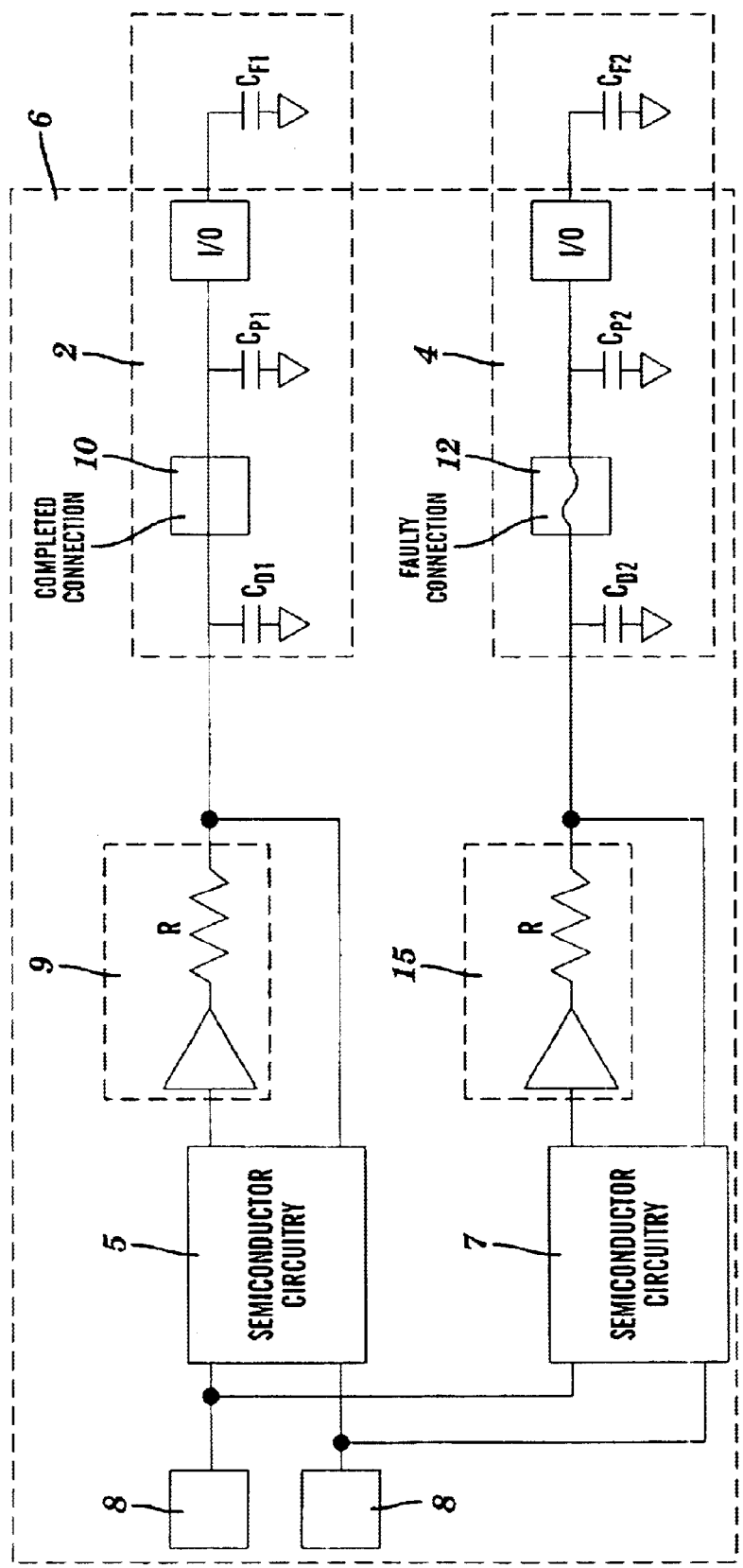
FIG. 2 illustrates an electrical model of an embodiment of the present invention having a weak driver coupled to a semiconductor device under test.

In accordance with embodiments of the present invention, a method and device is provided whereby a plurality of chip-to-package connections on a semiconductor device may be tested from a single external test site, or smaller plurality of test sites. FIG. 2 illustrates a simple model of a chip-to-package testing method and device configured according to an embodiment the invention. As shown in FIG. 2, a packaged semiconductor device coupled to a test fixture may be modeled as a fixture capacitance CF coupled in parallel with a device capacitance CD and a package capacitance CP. In practice, there are also resistances caused by the connections between the various elements of the system. However, for the purposes of the model shown in FIG. 2, the resistance caused by those connections are negligible compared to the other resistances discussed hereafter.

FIG. 2 includes two exemplary models 2 and 4 of a packaged semiconductor device 6 in a tester fixture. Using the AC CIO wrap method disclosed in U.S. Pat. No. 6,058,496 to Gillis et al., previously incorporated herein by reference, a plurality of common inputs/outputs (I/Os) of a semiconductor device may be accessed and tested through control pads 8. Control pads 8 of the present invention may be configured as pins, pads, balls or any other electrical connections to the semiconductor device 6. Semiconductor circuitry 5 and 7, such as clock trees, latches, receivers, and the like, necessary for the AC CIO wrap method of Gillis, is coupled to the control pads 8. Box 10 represents a completed chip-to-package connection; box 12 represents a faulty chip-to-package connection. As shown in the modeled embodiment of FIG. 2, the packaged semiconductor device 6 is tested using weak drivers 9 and 15. As used herein, "weak driver" is intended to mean and include a driver which is configured to be sensitive to capacitive loading. For example, a conventional device driver is configured to be a 5 $\hat{I}©$, 10 $\hat{I}©$, 20 $\hat{I}©$ or 35 $\hat{I}©$ driver. By adding, for example, a large resistor (i.e. 1 k$\hat{I}©$ or larger) in series with the driver to make it more sensitive to capacitive loading, the driver becomes a weak driver.

The weak driver of the embodiment modeled in FIG. 2 is a conventional driver, which has been modified by adding a 10 K$\hat{I}©$ resistor R in series with the driver signal. A weak driver may also be formed using any method known in the art to increase the slope of a response to a transition at an input due to the impedance load coupled to it. One way to achieve this is to appropriately couple an additional impedance element, such as a resistor or a small field effect transistor (FET), between the driver elements and the common I/O pad. Alternatively, a capacitive element configured as a capacitive divider is also feasible.

It will be clear to those of ordinary skill in the art that while two chip-to-package connections are illustrated for exemplary purposes in FIG. 2, any number of I/Os may be tested through common control pads if they are so configured. Each of the chip-to-package connections 2 and 4 of FIG. 2 should be understood to represent one or more chip-to-package connections. In one particular embodiment of the invention, a semiconductor device is configured for use with a reduced pin count tester; the semiconductor device having more than 1800 I/O pins tested through only 64 control pins. There is no restriction on the ratio between how many I/Os may be tested through the control pads. In some cases, as few as only 1 or 2 additional I/Os may be tested through the control pads, in other cases several hundred I/Os may be tested through the control pads. Additionally, the control pads may be configured as any external connection to the semiconductor device such as a logic control connection, a clock connection, a data connection, an I/O, or any other connection to the chip which is accessible by a tester.

Figure 3:
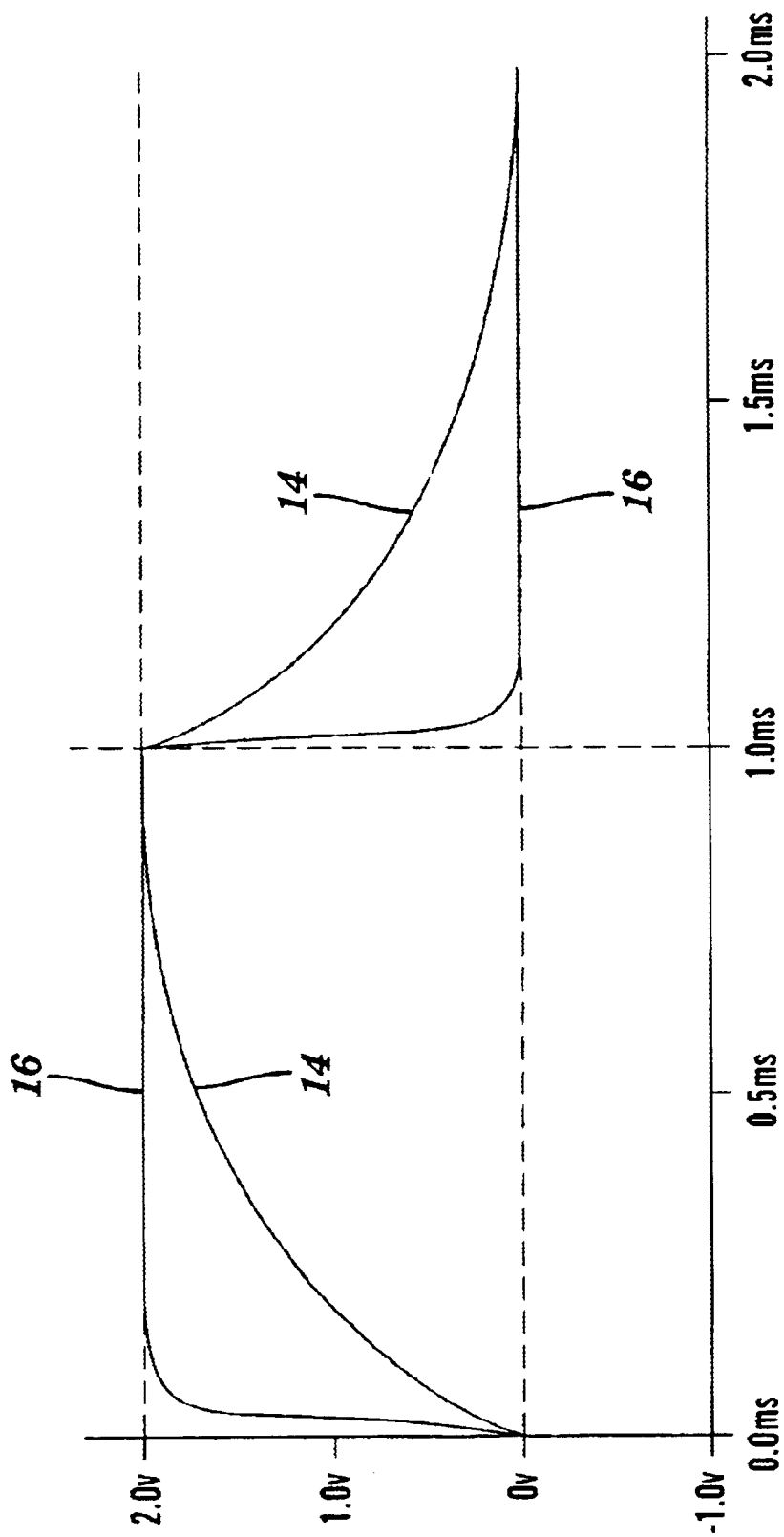
FIG. 3 illustrates a graph of two transition signals at two I/Os of a semiconductor device under test according to an embodiment of the invention.

Embodiments of the present invention test the chip-to-package connection of a plurality of I/Os of a semiconductor device by launching a signal transition from a weak driver to each of the I/Os to be tested and by evaluating the loading of each I/O through a return signal to see if the packaging is coupled to the device at each I/O. FIG. 3 is a graph illustrating the response of the packaged semiconductor device I/Os shown in the model of FIG. 2. A first graph line 14 shown in FIG. 3 represents the voltage response of the first exemplary model 2 to a transition signal applied at the control pad 8. Where the chip package and fixturing are coupled to the semiconductor device, as in completed chip-to-package connection box 10, the transition of the response is slow as compared to a disconnected response. A second graph line 16 represents the voltage response of the second exemplary model 4 to a transition signal introduced at the control pad 8. Where the chip package and fixturing are not correctly coupled to the semiconductor device, as in faulty chip-to-package connection box 12, the transition of the response is fast compared to the transition of the connected response. The test equipment associated with the driver differentiates between the rise times of the two signals, and thereby may identify faulty chip-to-package connections and take appropriate action. Appropriate action may include, but is not limited to, actions such as rejecting the semiconductor device completely, identifying the device for repair or further testing, or marking or otherwise identifying the faulty I/O so that it will not be relied upon by the semiconductor device or so that the semiconductor device may be applied to an application where the faulty I/O is not needed.

Figure 4:
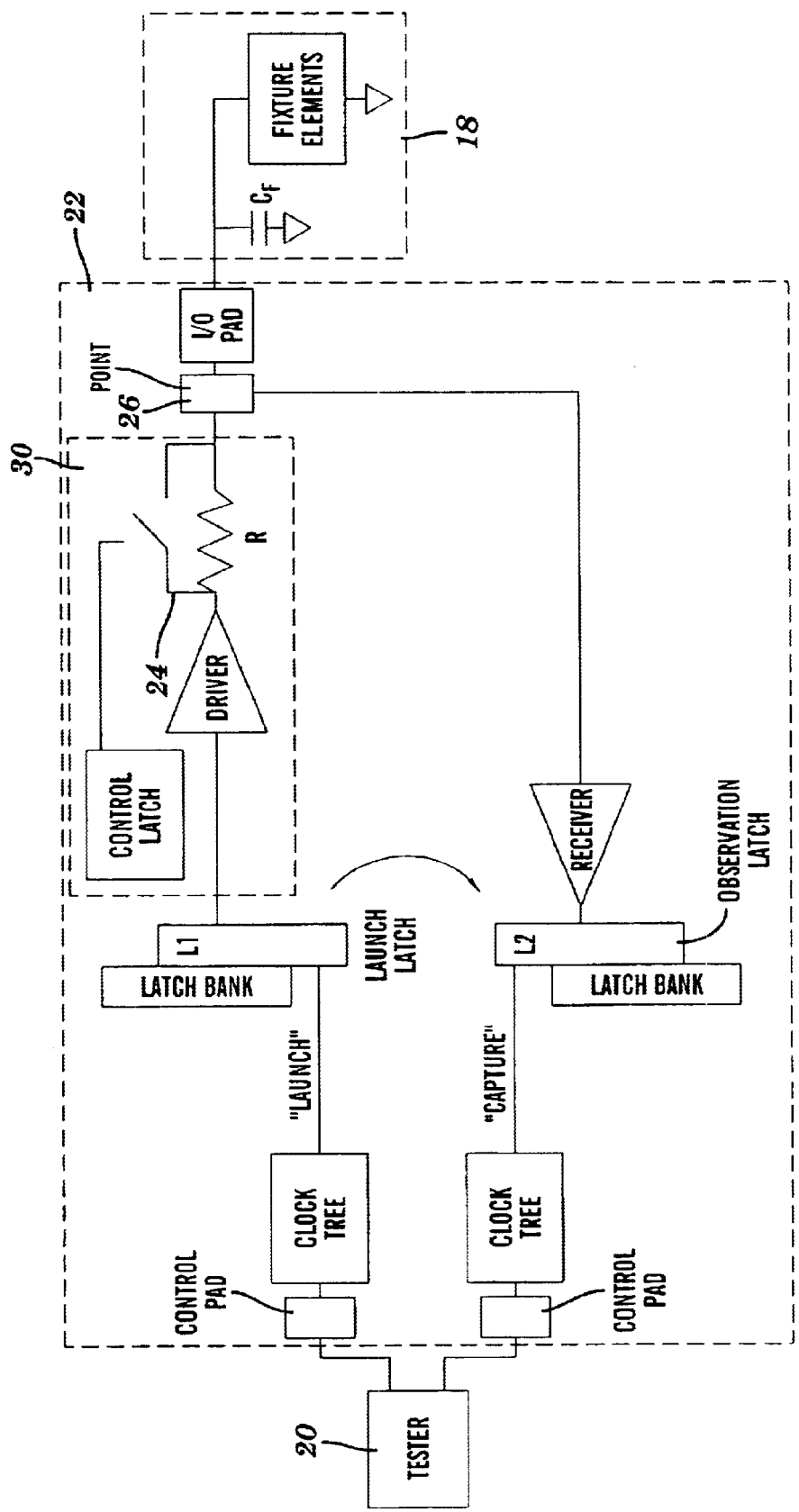
FIG. 4 illustrates an embodiment of the present invention configured with a switchable impedance in the weak driver and an additional impedance in the fixturing.

FIG. 4 illustrates a particular embodiment of the invention including, in association with an I/O of a semiconductor device 22 in a testing fixture 18, a launch latch, a driver, a capture latch and a receiver. A tester 20 is coupled to control pads of the semiconductor device 22 for testing. The launch latch, driver, capture latch and receiver associated with the I/O are accessible from the control pads through a clock tree of the semiconductor device (See disclosure of U.S. Pat. No. 6,058,496 to Gillis et al., previously incorporated herein by reference, for a discussion on how the control pads may be used to access I/Os through a clock tree). For this particular embodiment, the weak driver resistor R included within the device driver 30 is switchable in that it includes a switch 24 coupled around it. The switch may be controlled by control latch of the testing equipment 20, or by some other control switch or latch on the device 22. A switch, or any element which may create an electrical short across or otherwise bypass a portion of a circuit, may be used to place the weak driver resistor R into or out of series or parallel connection with the driver and tester elements during a particular testing stage to enable the testing equipment 20 to be used for other tests where it may not be desirable to have a weak driver. Due to the slowed and less precise response caused by a weak driver, conventional testing methods disapprove of weak drivers. As a result, conventional drivers are designed and configured to be insensitive to capacitive loading to reduce error and speed response times. Temporarily placing a large resistor into series connection with a conventional driver for a portion of a test sequence allows the driver to be a weak driver for that portion of the test sequence. It should be made clear, however, that the switch is not required to practice the invention. Alternatively, a variable impedance may be used. Furthermore, although the embodiment of FIG. 4 shows the "Launch" and "Capture" paths from the tester to the I/O pad to be separate paths, it will be clear to one of ordinary skill in the art that the same launch bank, clock tree and control pad may be used for both the "Launch" and "Capture" paths.

Figure 5:
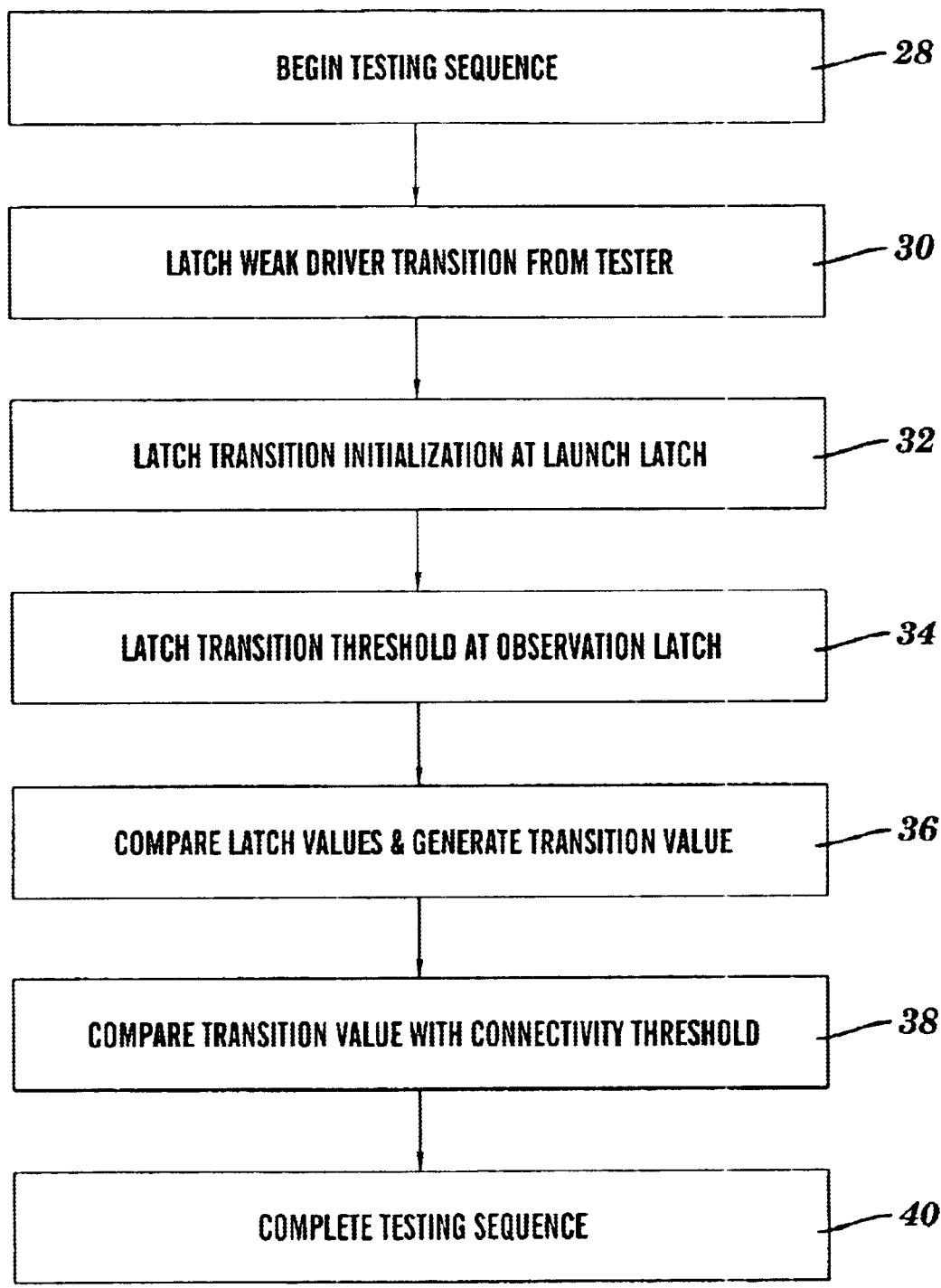
FIG. 5 illustrates a method of testing a semiconductor device according to an embodiment of the invention.

In reference to FIGS. 4 and 5, a method of testing the chip-to-package connection of the I/Os of a semiconductor device using reduced pin count testing is disclosed. To begin, a testing sequence is begun (step 28), which may include performance of numerous I/O and other tests upon the semiconductor device. In step 30, a weak driver transition signal is then applied at a control pad to test a first I/O of a semiconductor device 22 coupled to a testing fixture 18. The timing of the initialization of the test signal transition is triggered into a launch latch L1 associated with a latch bank within the semiconductor device 22 (step 32). An observation latch L2 associated with the same or a different latch bank within the semiconductor device 22 is triggered when the transition signal, measured at a point 26 on the semiconductor device prior to the chip-to-package connection, reaches a predetermined threshold (step 34). Point 26 is only shown as one example of a location at which the transition signal may be measured. Other locations are also acceptable.

The predetermined threshold may be any threshold amount and may vary depending upon the test signal magnitude, the sensitivity of the testing and latch elements, and numerous other factors considered by those of ordinary skill in the art when determining an acceptable rise time for comparison. By a comparison of the timing and values captured in the first and second latches L1 and L2, a rise time or other transition value may be calculated which is indicative of whether the chip-to-package connection for that particular I/O is faulty (step 36). The transition value from the latches may thereafter be converted to another value indicative of whether the chip-to-package connection is faulty if this is desirable in a particular application. One value conventionally useful to those of ordinary skill in the art in determining the slope of a transition signal is the resistive/capacitive (RC) constant of the system.

The transition value, such as the rise time, derived from the evaluation of the values stored in association with the launch and observation latches may then be compared to a connectivity threshold to determine if the transition value indicates a completed chip-to-package connection (step 38). For example, with a transition value equal to the rise time, a comparison may be made to an acceptable rise time threshold value to determine whether rise time is sufficiently slow to indicate an acceptable chip-to-package connection. This connectivity threshold may be selected from previous or subsequent tests of the same semiconductor device 22 to find an acceptable rise time compared to the other I/Os on the device, for example, or may be determined as a standard for all devices from previous tests on other devices of a similar kind.

By way of practical example, in reference to the graph shown in FIG. 3, if an acceptable rise value threshold of 80% were selected, the two lines would be clearly distinguishable. The first graph line 14, representative of the completed chip-to-package connection, does not rise to 80% of its maximum until around 0.5 η¼s. The second graph line 16, representative of a faulty chip-to-package connection, rises to 80% of its maximum before 0.1 η¼s. Therefore, any rise time threshold selected between these values, for example at 0.3 η¼s, may be acceptable for distinguishing between completed and faulty chip-to-package connections.

A similar procedure may be performed for each I/O chip-to-package connection for the semiconductor device from the same, or from any number of other control pads. For a particular I/O, a plurality of tests may be performed in conjunction with the connectivity test prior to testing another I/O, or a single test may be performed on all of the I/Os before moving to another test. Regardless of the order of the tests, however, after the transition value is compared to the connectivity threshold, the testing sequence may at some time be completed (step 40).

In a case where the packaging of the semiconductor device is not sufficiently capacitive to slow the rise time of the transition at the I/O, an additional fixture capacitor CF (for example 10 pf), may be added in parallel with the fixture elements and coupled to a potential relative to the semiconductor device. In any case, the added fixture impedance, which may be switchable or variable, will further slow the rise time of the transition on an I/O with a completed chip-to-package connection. One of ordinary skill in the art may readily determine when an additional fixture impedance is needed within the fixturing 18 for a given application configuration to adequately differentiate between the transitions of a completed and a faulty chip-to-package connection.

Thus, device embodiments configured according to the teachings of the present invention enable testing of semiconductor devices using reduced pin count testing of chip-to-package connectivity. A weak driver may be used to generate a weak driver signal by adding a fixed or switchable impedance in series with the device driver. Additional impedance elements may be added to testing or fixturing equipment to increase the sensitivity of the equipment to the effects of capacitance within the testing system. And, transition thresholds and connectivity thresholds may be selected to be any value, as appropriate for a particular application, which will assist the tester in determining whether the chip-to-package connection is faulty.

It will be clear to those of ordinary skill in the art that the fixed, variable or switchable impedance associated with the weak driver used in embodiments of the present invention may be added to the front end hardware on a conventional tester, may be formed as part of the fixture equipment, such as the semiconductor device socket, may be part of the printed circuit board (PCB) that the socket is mounted to, or may be formed as a physical or parasitic part of the layout for the main printed circuit board of the tester. Alternatively, it is also possible to locate the weak driver on the test equipment and multiplex the driver to each device I/O under test for the purposes of this test.

While the invention has been particularly shown and described with reference to specific embodiments thereof, it will be understood by those skilled in the art that various changes in form and detail may be made thereto, and that other embodiments of the present invention beyond embodiments specifically described herein may be made or practiced without departing from the spirit of the invention as limited solely by the appended claims.

What is claimed is:

1. A method of reduced pin count testing a chip-to-package connectivity of a semiconductor device, the method comprising:
    providing an I/O driver and an I/O receiver on the semiconductor device, wherein a common I/O of the semiconductor device is electrically coupled to the driver and to the receiver, and wherein the common I/O is electrically interposed between the driver and the receiver;
    launching a transition signal from the driver;
    observing a response of the transition signal at a point within the semiconductor device; and
    determining whether a chip-to-package connection associated with the common I/O is faulty from the response of the transition signal.

2. The method of claim 1, further comprising driving the transition signal with a weak driver.

3. The method of claim 1, further comprising:
    providing an observation latch on the semiconductor device; and
    triggering the observation latch when the transition signal reaches a predetermined threshold.

4. The method of claim 1, providing a weak driver impedance on the semiconductor device.

5. The method of claim 4, wherein the weak driver impedance is electrically interposed between the driver and the common I/O.

6. The method of claim 4, wherein the point is electrically interposed between the weak driver impedance and the common I/O.

7. The method of claim 4, wherein the weak driver impedance is an impedance having a resistive value of 1 KΩ or more.

8. The method of claim 4, further comprising providing a fixture impedance coupled between a test fixture and the semiconductor device, wherein said launching comprises launching the transition signal from the driver through the weak driver impedance and the common I/O to the test fixture.

9. The method of claim 8, wherein the fixture impedance comprises a capacitor.

10. An apparatus configured to launch a test signal to a common I/O of a semiconductor device from an I/O driver on the semiconductor device which is associated with the common I/O using reduced pin count testing, the apparatus comprising:
    a test fixture configured to couple to the common I/O of the semiconductor device;
    an I/O receiver on the semiconductor device, wherein the common I/O is electrically coupled to the driver and to the receiver, and wherein the common I/O is electrically interposed between the driver and the receiver;
    a weak driver impedance coupled between the driver and the test fixture;
    wherein the apparatus is configured to launch the test signal through the weak driver impedance and the common I/O to the test fixture and evaluate a characteristic of a response to the test signal to determine whether a chip-to-package connection associated with the common I/O is faulty.

11. The apparatus of claim 10, wherein the weak driver impedance includes a switchable impedance.

12. The apparatus of claim 10, wherein the weak driver impedance is an impedance having a resistive value of 1 KΩ or more.

13. The apparatus of claim 12, wherein the weak driver impedance is approximately 10 KΩ or more.

14. The apparatus of claim 10, further comprising a fixture impedance coupled between the test fixture and the semiconductor device.

15. The apparatus of claim 14, wherein the fixture impedance comprises a capacitor.

16. The apparatus of claim 10, wherein the weak driver impedance includes a variable impedance.

17. The apparatus of claim 10, wherein the weak driver impedance is on the semiconductor device.

18. The apparatus of claim 10, wherein the weak driver impedance is electrically interposed between the driver and the common I/O.

19. The apparatus of claim 10, further comprising a point at which test signal is adapted to be measured, wherein the point is electrically interposed between the weak driver impedance and the common I/O.

20. The apparatus of claim 10, further comprising an observation latch on the semiconductor device, wherein the observation latch is adapted to be triggered when the test signal reaches a predetermined threshold.

* * * * *